US006542351B1

(12) United States Patent
Kwang

(10) Patent No.: US 6,542,351 B1
(45) Date of Patent: Apr. 1, 2003

(54) CAPACITOR STRUCTURE

(75) Inventor: Kyuwoon Kwang, Palo Alto, CA (US)

(73) Assignee: National Semiconductor Corp.

(*) Notice: Subject to any disclaimer, the term of this patent is extended or adjusted under 35 U.S.C. 154(b) by 0 days.

(21) Appl. No.: 09/895,771

(22) Filed: Jun. 28, 2001

(51) Int. Cl.$^7$ ............................................. H01G 4/005
(52) U.S. Cl. ...................... 361/303; 361/321.2; 361/309
(58) Field of Search ........................... 361/301.1, 301.2, 361/301.3, 301.4, 303–304, 306.3, 308.1, 309–313, 320, 321.1–321.5, 328, 329, 330

(56) References Cited

U.S. PATENT DOCUMENTS 4,017,820 A  *  4/1977  Ross ........................... 338/325
5,573,808 A  * 11/1996  Gruenwald et al. .......... 156/239
6,266,226 B1 *  7/2001  Hayashi ..................... 361/301.4

* cited by examiner

Primary Examiner—Anthony Dinkins
(74) Attorney, Agent, or Firm—Jurgen Vollrath

(57) ABSTRACT

In a capacitive structure of an integrated circuit a comb-like configuration or other thin element configuration provides for capacitive coupling between electrode elements in one plane. By forming electrodes in a plurality of planes and selectively shifting the positioning of the electrodes in one plane relative to those in another plane, capacitive coupling between the electrodes in the different planes is achieved. In this way capacitance and stability with process variations can be affected. Furthermore, by using the metal interconnect layers to form the capacitive structures, the need for additional process steps in defining poly-layers, is avoided.

8 Claims, 6 Drawing Sheets

CAPACITOR STRUCTURE

FIELD OF THE INVENTION

This invention relates to an improved capacitor structure and a method of making it.

BACKGROUND OF THE INVENTION

A typical capacitor, such as the capacitor 150 illustrated in FIG. 15, comprises two electrodes 152, 154 separated by a distance 156 with air or some dielectric material 158 between the electrodes. The electrodes or plates 152, 154 may take a variety of shapes and may, for example, be wound up into a cylindrical shape. The main purpose for this is to increase the size of the electrodes 152, 154. Since the capacitance is dependent on the size of the electrodes, dielectric constant, and the separation between the electrodes, much work has been put into increasing the size of the electrodes and minimizing the separation between the electrodes.

In the field of integrated circuits, capacitors are implemented to perform capacitive functions. A common approach is to use a poly-poly capacitor comprising two polysilicon electrodes of highly doped silicon separated by a dielectric. Due to the nature of semiconductors, capacitors in the integrated circuit arena typically have planar electrodes. The capacitance is therefore dictated by the three factors mentioned above, namely the size of the electrodes and the separation between the electrodes. One drawback of using poly-poly capacitors is the need for the deposition of a special poly layer, requiring additional process steps and thus increased cost.

An additional problem encountered in the manufacturing of capacitors in integrated circuits is caused by process variations which may result in different thicknesses electrodes and variations in the thickness of the dielectric layer. It will be appreciated that such changes will invariably effect the capacitance. More specifically, a ten percent change in the dielectric thickness will correlate directly to a ten percent variation in capacitance.

Ideally, therefore, it is desirable to have a capacitor structure that displays the maximum capacitance, stability in spite of process variations, and avoids, as much as possible, the need for additional process steps.

SUMMARY OF THE INVENTION

According to the invention, there is provided a capacitor structure, and a method of creating such a structure in a semiconductor device, comprising at least two electrodes separated by dielectric, wherein the electrodes have a comb-like structure. Preferably the electrodes are made of metal. The electrodes may lie in the same plane with fingers of the comb-like structures extending between one another in alternating fashion. Additional electrode pairs may lie on different planes separated by one or more dielectrics extending between the planes. Electrodes of the same polarity may be aligned with one another so that the fingers of electrodes of the same polarity lie in the same vertical plain, separated by the dielectric. Instead, the electrodes of the same polarity lying in different planes may be horizontally shifted with respect to one another which has the effect of increasing the side-wall coupling capacitance. This also has the added benefit of making the structure more resistant to parameter variations due to process variations. By optimizing the relative shift between electrodes in one plane relative to those in another plane, changes in capacitance value due to variations in inter-dielectric thickness can be largely eliminated.

In a preferred embodiment, more than two electrodes are used to define the capacitor.

Instead of the using substantially parallel extending fingers, the shape of the electrode may, instead take the form of a spiral structure or other shape that defines one or more elongate electrode elements to increase side-wall coupling capacitance and permit the flexibility of shifting one electrode relative to another one.

Preferably the electrodes are created from the metal interconnect layers commonly found in integrated circuits for forming the metal interconnect lines.

DETAILED DESCRIPTION OF THE INVENTION

Figure 1:
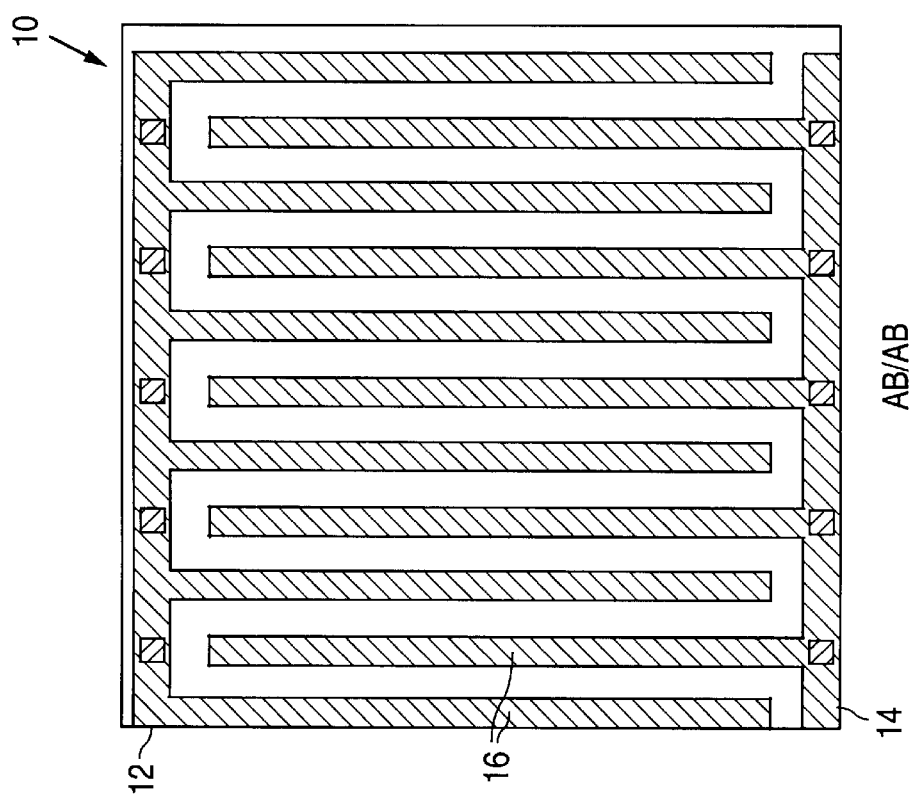
FIG. 1 is a plan view of one embodiment of the invention.

FIG. 1 shows one embodiment of the invention. For convenience the capacitor plates will be distinguished by referring to the way the capacitor will be connected, namely as being of one or the other polarity. This is not to be read as suggesting that the capacitor plates are necessarily dedicated to connection to either a high or a low voltage rail.

The capacitor 10 comprises a first electrode 12 of one polarity and a second electrode 14 of the opposite polarity, lying in the same plane. In the semiconductor environment, the metal interconnect layers are simply patterned to define the electrodes 12, 14. This has the advantage that no additional poly layers have to be formed in order to create the capacitor. As shown in FIG. 1, the fingers 16 of the two electrodes of this embodiment extend between each other in alternating fashion to provide for horizontal capacitive coupling between the electrodes 12 and 14.

Figure 2:
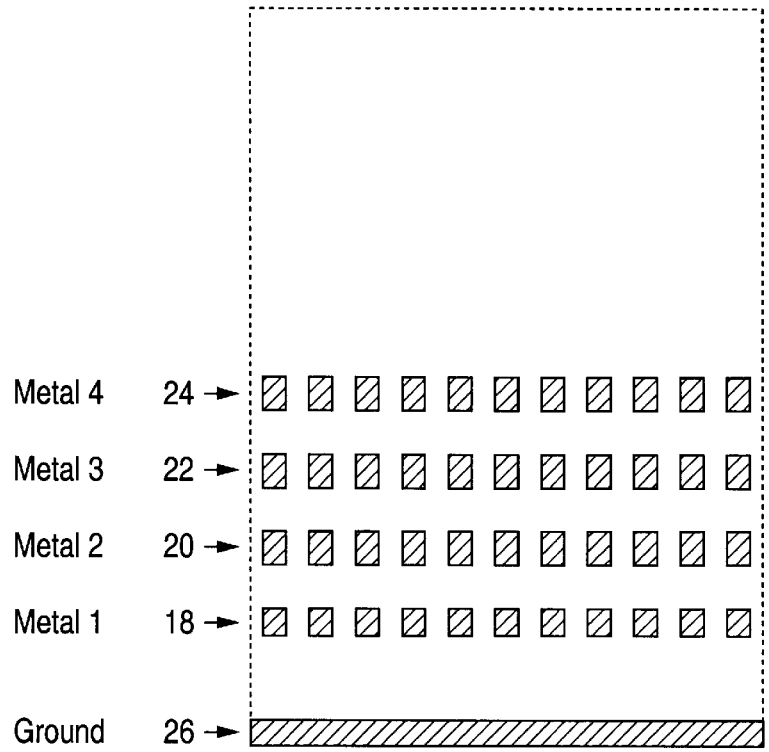
FIG. 2 is a sectional representation through the embodiment of FIG. 1.

FIG. 2 shows a schematic representation of a cross-section through the structure of FIG. 1. As shown in FIG. 2, the structure 10 comprises four metal layers 18, 20, 22, and 24, arranged vertically above a ground layer 26, each of the layers 18, 20, 22, 24 defining pairs of electrodes 12, 14. Thus additional capacitive coupling is achieved in the plane perpendicular to the metal interconnect layers 18, 20, 22, 24. The nature and extent of the capacitive coupling between electrodes 12, 14 on a layer, and between layers, as well as the stability with process variations, can be effected by varying the relative positions of the electrodes in the different layers, as is discussed in greater detail below.

Figure 6:
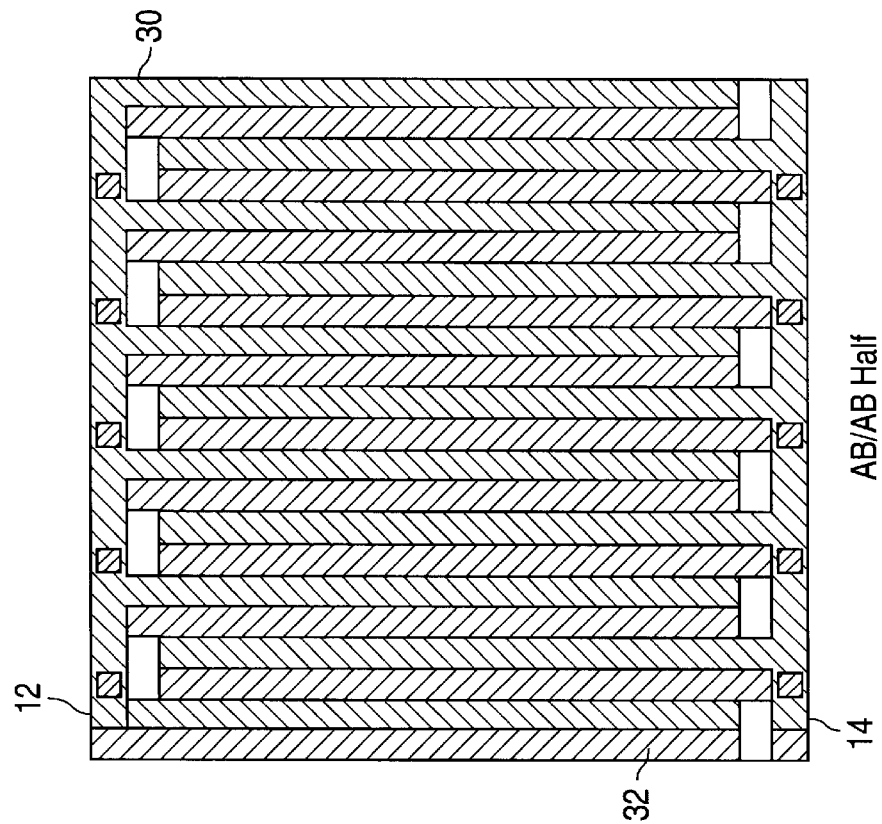
FIG. 6 is a plan view of the embodiment illustrated in FIG. 4.
Figures 3, 4, 5:
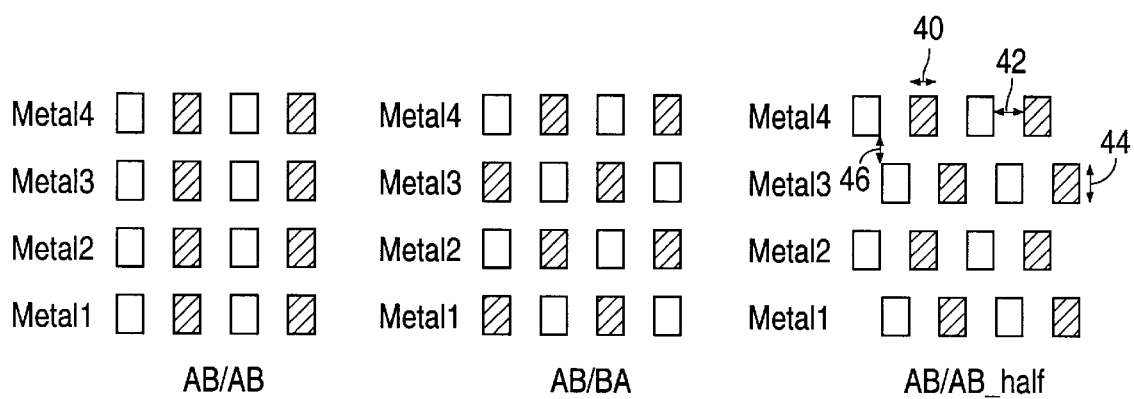
FIG. 3 is a schematic representation of the embodiment of FIG. 1 showing the structure in sectional format.
FIG. 4 is a schematic representation of another embodiment.
FIG. 5 is a schematic representation of yet another embodiment of the invention.

In accordance with the invention various embodiments of the comb-like structure can be implemented as illustrated in FIGS. 3, 4, and 5. In FIG. 3, the four metal layers are shown with alternating electrode fingers extending in a horizontal plane while in a vertical plane the electrodes of the same polarity are aligned with one another. Thus, the electrodes 12, of one polarity are all vertically aligned with one another. Similarly, the electrodes 14 of the opposite polarity are aligned with one another in a vertical plane. For purposes of convenience, this configuration will be referred to as AB/AB to signify that a finger of the one electrode 12 (electrode A) is followed in the horizontal plane by a finger of the opposite electrode 14 (electrode B), and that in the next metal layer, the same configuration is maintained. In contrast, in the embodiment illustrated in FIG. 4, which is designated as AB/BA, electrodes 12 and 14 alternate horizontally in an AB fashion while in an adjacent metal layer, polarities are reversed to give a BA configuration. This configuration is therefore depicted as AB/BA. Yet another embodiment is illustrated in FIG. 5 in which the metal layers are shifted horizontally with respect to one another. This configuration is depicted as AB/AB_Half to indicate that the electrodes in each of the metal layers are shifted in adjacent metal layers by half a pitch of the fingers of the comb-like structure. This configuration is illustrated in plan view in FIG. 6. For convenience, the same reference numerals 12, 14 have been used for the opposite polarity electrodes. Furthermore, due to the half shift, both the top metal layer 30 (metal 4) and the next metal layer 32 (metal 3) are visible in FIG. 6.

Figure 7:
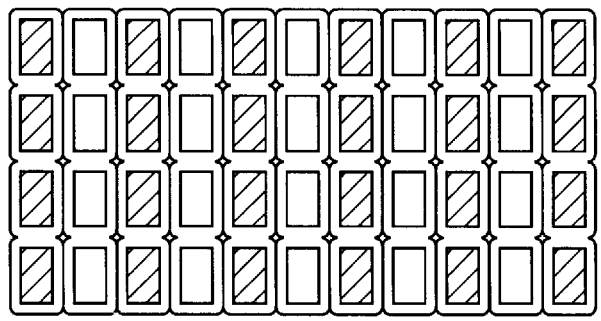
FIG. 7 shows the potential distribution for an embodiment as illustrated in FIG. 3.
Figure 8:
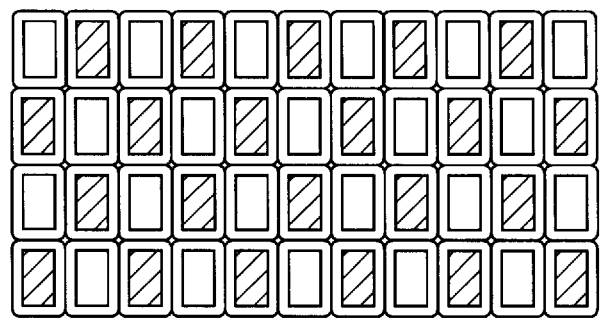
FIG. 8 shows the potential distribution for an embodiment illustrated in FIG. 4.
Figure 9:
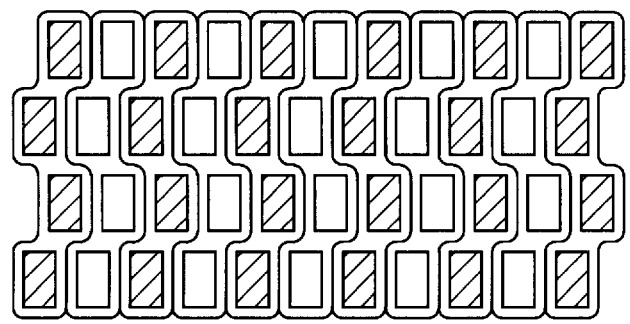
FIG. 9 shows a potential distribution for an embodiment as illustrated in FIG. 5.

The effects of the various configurations illustrated in FIGS. 3, 4, 5 are shown by means of potential distribution diagrams, FIGS. 7, 8, 9, respectively. As shown in FIG. 7, for the AB/AB structure the potential variation between electrodes is maximized in the horizontal plane while the potential stays more or less constant in the vertical plane from one metal layer to the next. In contrast, in FIG. 8, for the AB/BA structure, there is approximately equal potential variation in the horizontal and in the vertical planes. In FIG. 9, for AB/AB_Half, the potential lines in the vertical plane take on a wavy configuration.

Figure 10:
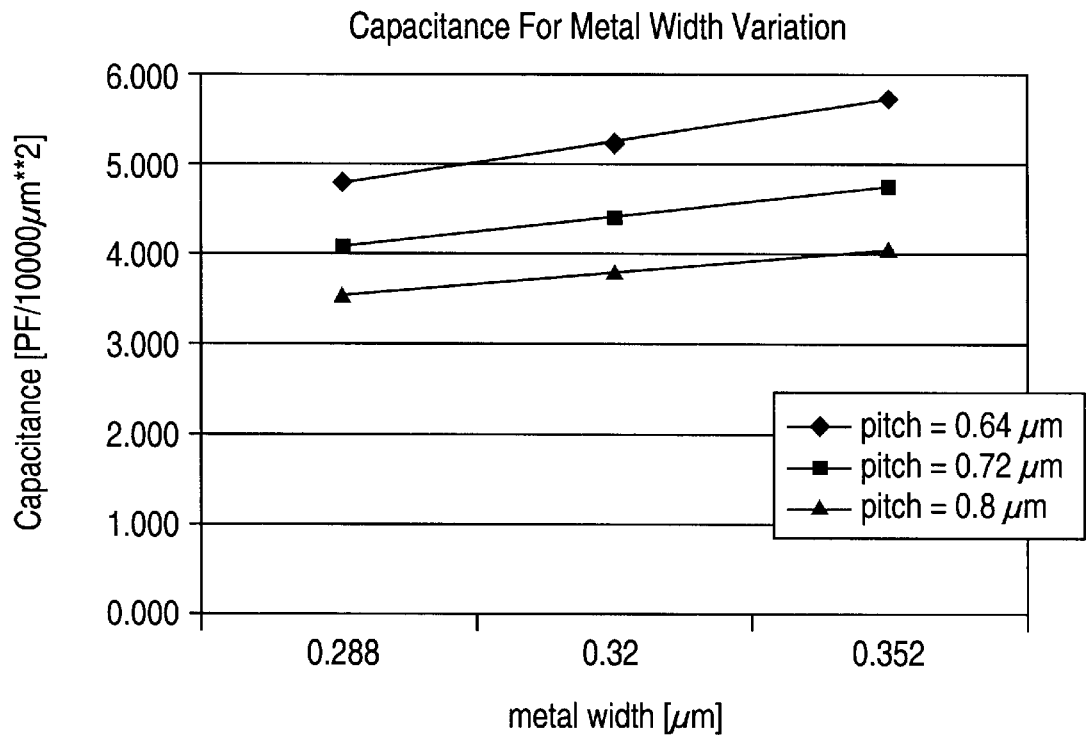
FIG. 10 shows graphs of various embodiments of the invention showing changes in capacitance with variations in metal width.
Figure 11:
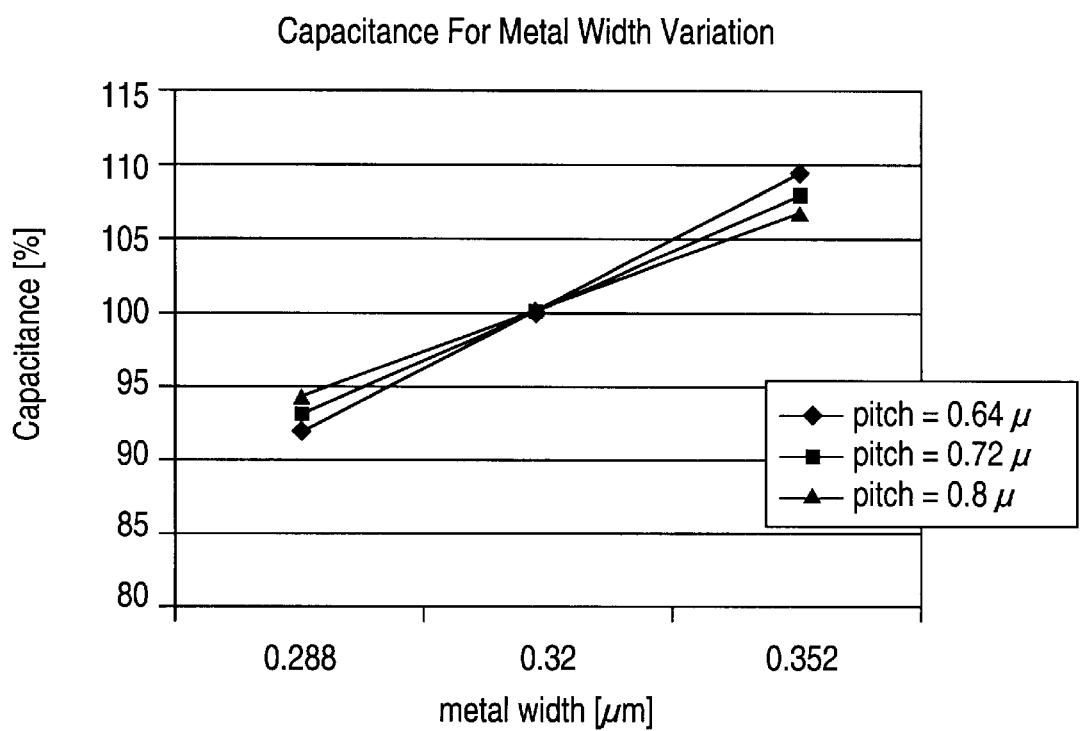
FIG. 11 shows graphs of various embodiments of the invention showing percentage changes in capacitance due to variations in metal width.

Using simulation techniques using a Raphael simulator, various electrode configurations were investigated in order to analyze the effects of the width 40 of the electrode fingers, the spacing 42 and the thickness or height 44 on capacitance and capacitance variations. These dimensions are illustrated in FIG. 5 and variations in the width 40 are shown to produce capacitance variations varying not only with the width 40 but also the pitch from one electrode finger to the next. As shown in FIG. 10, as the pitch is decreased from 0.8 µm, down to a pitch of 0.64 µm, the capacitance increases irrespective of the metal width 40. Furthermore, capacitance is shown to increase with increasing metal width as shown by the increases from 0.288 µm up to a width of 0.352 µm. Thus, as the width 40 is increased and the spacing 42 decreased, capacitance is shown to increase. However, as is shown by the relative slopes of the graphs in FIG. 10, capacitance variation is more pronounced in the case of a smaller pitch. This is more clearly evident in FIG. 11 where the percentage change in capacitance with variation in metal width is illustrated. Clearly, the greatest capacitance variation is evident in the case of the 0.64 µm pitch used for purposes of this analysis. Thus, while capacitance can be increased by reducing the pitch this has to be weighed against the need for greater stability regarding capacitance variation with variations in pitch size. In the case where stability is of greater concern than the size of the capacitance, it may, therefore, be desirable to increase the spacing 42, thereby increasing the pitch and causing variations in the metal width to have less pronounced of an effect on capacitance variation.

Figure 12:
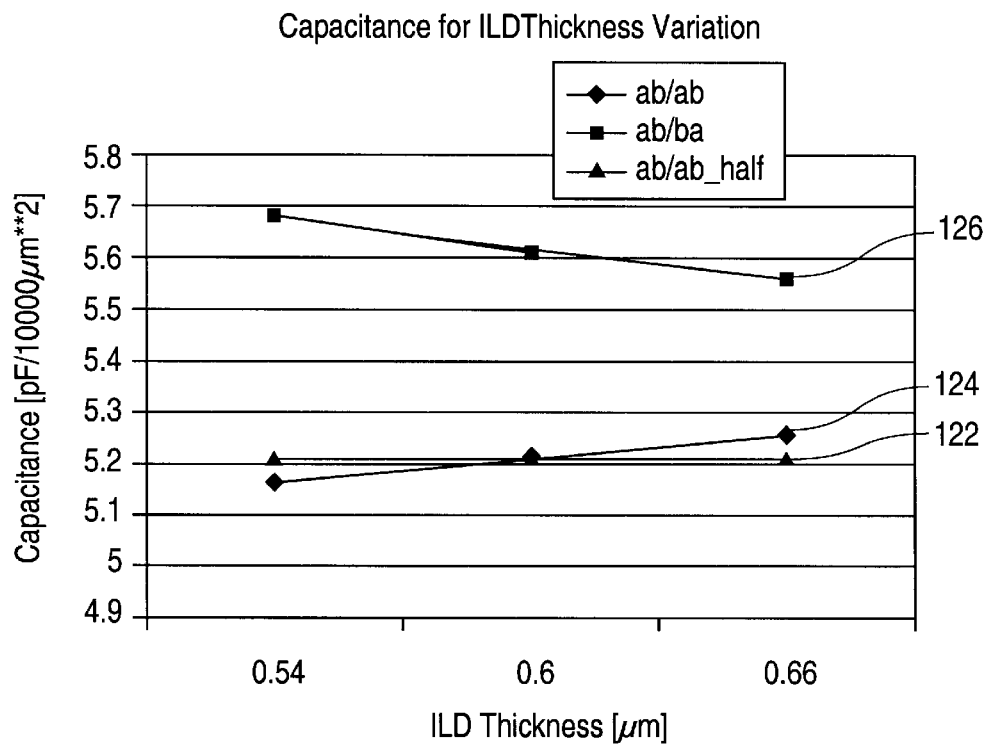
FIG. 12 shows graphs of various embodiments of the invention showing the change in capacitance with variations in interlayer dielectric thickness.

FIG. 12 illustrates the change in capacitance with variation in the interlayer dielectric (ILD) thickness for the various configurations illustrated in FIGS. 3, 4, and 5. As is evidenced by the substantially horizontal line for the AB/AB_Half configuration indicated by reference numeral 122, variations in interlayer dielectric thickness have no significant effect on the capacitance in this configuration, thus providing the most stable solution against process variations of ILD thickness. In contrast, the AB/AB configuration, indicated by reference numeral 124 displays a gradual increase in capacitance with increasing ILD thickness. This can be attributed to the fact that the electrodes of the same polarity are aligned vertically to define virtual vertical electrodes, which increase in vertical height as the ILD thickness increases. The AB/BA configuration is indicated by reference numeral 126 and shows a decrease in capacitance with increasing ILD thickness. This is due to the fact that capacitance is composed of both vertical and horizontal components in this configuration, and as the ILD thickness increases, the vertical component of the capacitance decreases. The AB/AB_Half configuration borrows characteristics from both the AB/AB and the AB/BA configurations. It thus acquires some of the increasing effects of the AB/AB configuration and some of the decreasing effects of the AB/BA configuration, to produce a substantially non-varying capacitance with changes in ILD thickness.

Figure 13:
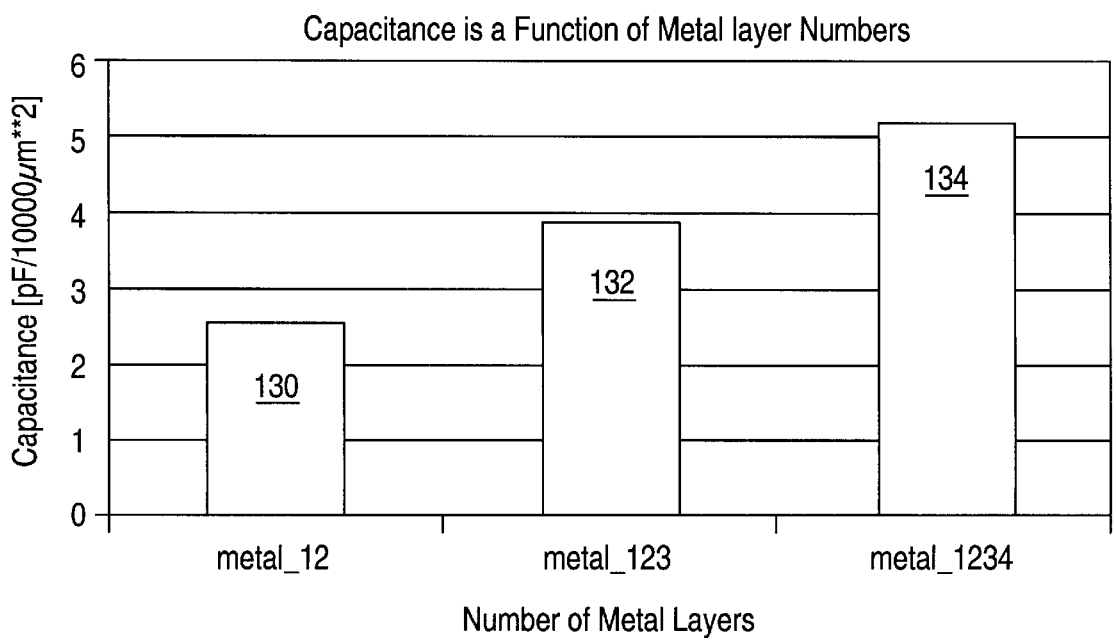
FIG. 13 shows capacitance variations with different numbers of metal layers for one embodiment of the invention.

The effect on capacitance for various numbers of metal layers was also considered and is illustrated in FIG. 13 for two metal layers as depicted by reference numeral 130, three metal layers as depicted by reference numeral 132, and four metal layers as depicted by reference numeral 134. As is clearly illustrated in FIG. 13, capacitance increases significantly with the number of metal layers. The comparison of FIG. 13 was done for the AB/AB configuration, however, increases were also evident for the other configurations as the number of metal layers were increased. Findings in pF/10000 µm² for different numbers of metal layers for the various configurations using a width of 0.32 µm, a spacing of 0.32 µm, a metal thickness of 0.47 µm, and ILD of 0.6 µm, was as follows:

|  | AB/AB | AB/BA | AB/AB Half |
|---|---|---|---|
| Metal_12 | 2.535 | 2.661 | 2.505 |
| Metal_123 | 3.874 | 4.135 | 3.858 |
| Metal_1234 | 5.216 | 5.611 | 5.21 |

The effect of changing the spacing 42 while keeping the width 40 constant, for a four layer system for each of the configurations were as follows in pF/10000 $\mu m^2$:

| WIDTH | SPACE | AB/AB | AB/BA | AB/AB HALF | VARIANCE |
|---|---|---|---|---|---|
| 0.32 | 0.32 | 5.216 | 5.611 | 5.21 | 9.20% |
| 0.32 | 0.4 | 3.899 | 4.345 | 3.911 | 7.80% |
| 0.32 | 0.48 | 3.032 | 3.527 | 3.066 | 6.50% |

Also, indicated in the table above, is the percentage variance due to a 10% variation in width.

As can be seen from the percentage variation, the largest space produces the greatest stability albeit at the expense of a lower capacitance.

The dramatic benefits of the present invention were most evident from the stability figures with ILD thickness variation. For a 10% variation in ILD thickness, a prior art poly-poly capacitor would display a 10% variation in capacitance. In contrast, the AB/AB configuration of the present invention showed only a 1% variation in capacitance, while the AB/BA configuration showed a 1.3% variation in capacitance, and the AB/AB_Half configuration showed a capacitance variation of only 0.1%.

Figure 14:
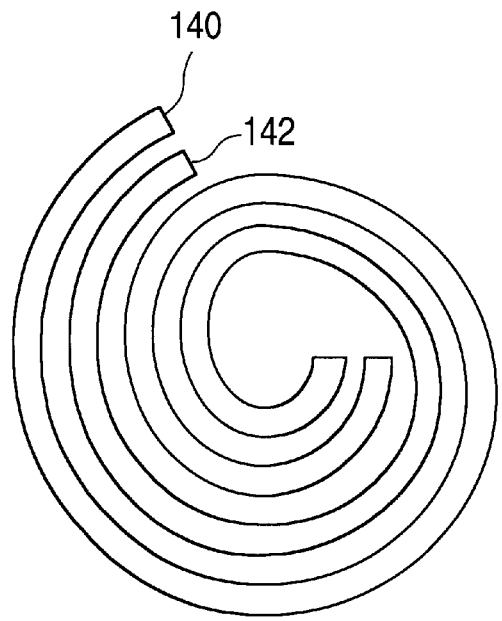
FIG. 14 is a plan view of another embodiment of the invention.
Figure 15:
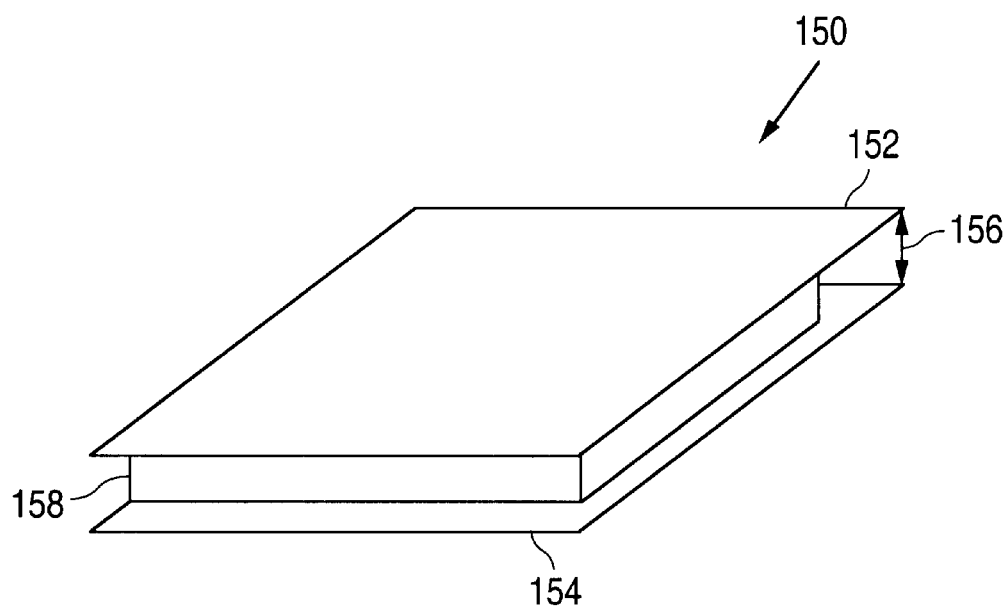
FIG. 15 is a simple three-dimensional view of a typical capacitor structure known in the prior art.

For illustrative purposes, another embodiment of the invention is shown in FIG. 14 which shows a plan view of an electrode having a spiral configuration. It will be appreciated that variations in capacitance and stability would also be achieved by providing for lateral shifts between the electrodes 140, 142 in one plane relative to electrodes in other planes.

The present invention provides the added benefit of avoiding the additional process steps of forming poly layers as required in the formation of prior art capacitors. Instead, the present invention makes use of existing metal interconnect layers and merely patterns these appropriately to define the capacitor structures of the invention.

It will also be appreciated that other than the spiral configuration of the electrode 140 or the comb structures of FIGS. 3, 4, and 5, other configurations could be used without departing from the scope of the invention. It will also be appreciated that relative horizontal shifts between the electrodes could be less than or more than half a shift to provide for varying degrees of capacitance and stability. Thus, while a few specific embodiments were described, it will be appreciated that the present invention is broad enough to cover any configuration or number of metal layers and dimensions that will provide capacitance and stability benefits as described herein.

What is claimed is:

1. A capacitor structure comprising a set of at least two electrodes lying in a first plane, separated by a dielectric, wherein each of the electrodes has a comb-like structure with fingers of the comb-like structures of the two electrodes extending between one another, and additional electrode sets defined on at least one additional plane lying substantially parallel to the first plane, wherein the planes are separated from each other by a dielectric.

2. A capacitor of claim 1, wherein the electrodes are made of metal.

3. A capacitor of claim 1, wherein electrodes of the same polarity in the different parallel planes are aligned with one another so that their fingers lie in the same plane perpendicular to the parallel planes.

4. A capacitor of claim 3, wherein electrodes of the same polarity lying in different parallel planes are shifted with respect to one another so that their fingers do not lie in the same plane perpendicular to the parallel planes.

5. A capacitor of claim 4, wherein said electrodes of the same polarity lying in adjacent parallel planes, are shifted by half a pitch of the fingers of the comb-like structure.

6. A capacitor of claim 4, wherein said electrodes of the same polarity lying in adjacent parallel planes, are shifted by one pitch of the fingers of the comb-like structure.

7. A capacitor of claim 1, wherein additional similar electrode pairs are defined on at least one other, substantially parallel, metal interconnect layer, and wherein the electrodes in the various layers are arranged relative to each other to facilitate capacitive coupling between the electrodes in the different layers.

8. A capacitor in a semiconductor device, comprising at least one metal interconnect layer patterned to form a pair of spiral structures on the same layer to define a pair of electrodes that are aligned to facilitate capacitive coupling between the electrodes.

* * * * *